(12) United States Patent
Mylsamy

(10) Patent No.: US 10,466,291 B2
(45) Date of Patent: Nov. 5, 2019

(54) SIGNAL PROCESSING UNIT AND SIGNAL PROCESSING METHOD

(71) Applicant: Rohde & Schwarz Gmbh & Co. KG, München (DE)

(72) Inventor: RaajaGuru Mylsamy, Singapore (SG)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 246 days.

(21) Appl. No.: 15/394,247

(22) Filed: Dec. 29, 2016

(65) Prior Publication Data

US 2018/0188287 A1  Jul. 5, 2018

(51) Int. Cl.
*G01R 31/02* (2006.01)
*G01R 31/00* (2006.01)
*G01R 1/18* (2006.01)

(52) U.S. Cl.
CPC .............. *G01R 31/002* (2013.01); *G01R 1/18* (2013.01)

(58) Field of Classification Search
USPC .................. 324/627–629, 750.2; 455/67.11
See application file for complete search history.

(56) References Cited

U.S. PATENT DOCUMENTS

| | | | |
|---|---|---|---|
| 2002/0160717 A1* | 10/2002 | Persson .............. | G01R 29/0821 455/67.11 |
| 2012/0155022 A1* | 6/2012 | Alcala ................ | G01R 29/0814 361/692 |
| 2016/0037286 A1* | 2/2016 | Narasimhan ............ | H04W 4/80 455/41.1 |

* cited by examiner

*Primary Examiner* — Vincent Q Nguyen
(74) *Attorney, Agent, or Firm* — Shumaker & Sieffert, P.A.

(57) ABSTRACT

A signal processing unit for testing an electronic device under test includes a test chamber for accommodating the device under test, the test chamber including first electrical contacts, and a main housing including a receiving portion for receiving the test chamber, and including second electrical contacts that contact the first electrical contacts of the test chamber in an inserted stated of the test chamber.

22 Claims, 4 Drawing Sheets

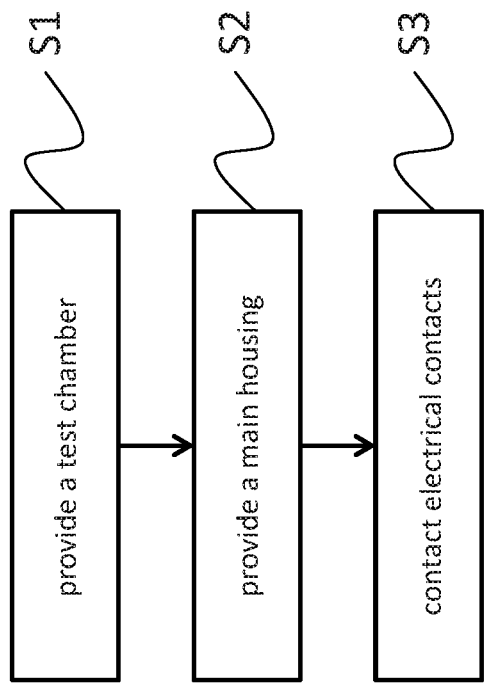

SIGNAL PROCESSING UNIT AND SIGNAL PROCESSING METHOD

TECHNICAL FIELD

The present invention relates to a signal processing unit. The present invention further relates to a respective signal processing method.

BACKGROUND

Although applicable in principal to any signal processing system, the present invention and its underlying problem will be mainly described hereinafter in combination with measurement systems.

In modern electronic systems a plurality of data connections or interface are provided to interface electronic devices. Such connections can be wired or wireless.

During development or production of such electronic devices measurements have to be performed e.g. to verify the compliance of the respective devices with standards or legal regulations.

Common test equipment comprises dedicated test housings that accommodate the DUT, Device Under Test, and are connected to respective measurement devices via cables. Such setups however are complex and error prone.

Against this background, the problem addressed by the present invention is providing a possibility to test electronic devices with reduced effort and increased reliability.

SUMMARY

The present invention solves this object by a signal processing unit with the features of claim 1 and by a signal processing method with the features of claim 14.

Accordingly it is provided:

A signal processing unit for testing an electronic device under test, the signal processing unit comprising a test chamber for accommodating the device under test, the test chamber comprising first electrical contacts, and a main housing comprising a receiving portion for receiving the test chamber, and comprising second electrical contacts that contact the first electrical contacts of the test chamber in an inserted stated of the test chamber, i.e. when the test chamber is coupled to the main housing or to the receiving portion of the main housing.

A signal processing method for testing an electronic device under test, comprises providing a test chamber for accommodating the device under test, the test chamber comprising first electrical contacts, providing a main housing comprising a receiving portion for receiving the test chamber, and comprising second electrical contacts, and contacting the first electrical contacts of the test chamber in an inserted state of the test chamber with the second electrical contacts.

The present invention is based on the finding that with higher frequencies, as they are used e.g. in modern telecommunication systems, measuring the transmission and reception quality of electronic devices becomes increasingly difficult. For example measurements with the same device may vary from one measurement to the next if the cables connecting the test housing to the measurement device is touched or moved. If even a slight bump to the table on which the measurement is performed influences the measurements it is difficult to perform reliable measurements with common setups.

The present invention further takes into account the decreasing size of the devices under test with increasing frequencies. This means that the test chamber can be smaller in size and still accommodate such devices under test.

The present invention therefore provides a signal processing unit, e.g. a measurement device, with a main housing and a separate test chamber. The test chamber is accommodated in a receiving portion of the main housing and the device under test can be inserted in the test chamber for testing.

The present invention therefore provides a single integrated apparatus that can test e.g. mobile devices of the next generation mobile networks. The single apparatus makes wires and separate test housings obsolete and therefore greatly simplifies test preparation and reduces test errors due to unsteady environmental conditions or movements of the test equipment, as with the commonly used test arrangements of today.

Further embodiments of the present invention are subject of the further subclaims and of the following description, referring to the drawings.

In a possible embodiment, the test chamber can be permanently, i.e. not easily removable, coupled to the receiving portion.

The test chamber may be fixed to the receiving portion such that it is not possible to remove the test chamber without respective tools or without opening the main housing. This allows providing a compact and easy to set up signal processing unit. The test chamber can e.g. be provided within the main housing such that only a front face of the test chamber is accessible for inserting and removing the device under test. If the test chamber is permanently coupled to the main housing, relative movement of the test chamber and the main housing is not possible. The problems arising in the state of the art e.g. with moving cables are therefore eliminated.

In a possible embodiment, the test chamber can be detachably, i.e. easily removable, coupled to the receiving portion. The test chamber may e.g. be coupled to the receiving portion by clips or clamps or by screws that can be easily removed, e.g. screws with a wing nut or the like. This allows exchanging the test chamber according to the respective measurement tasks that have to be performed. For example test chambers of different sizes or different materials can be provided for different measurement tasks.

In a possible embodiment, the main housing can comprise a locking device for locking the test chamber in position. The locking device can e.g. comprise a bolt or hook that engages a respective engagement opening in the test chamber when actuated. For example a lever or the like can be provided for a user to actuate the locking device. As an alternative or in addition the locking device can also be motor actuated. With the locking device, relative movement of the test chamber and the main housing can be prevented. The problems arising in the state of the art e.g. with moving or vibrating cables are therefore eliminated.

In a possible embodiment, the test chamber can comprise a shielded housing with a removable cover, e.g. a door. The shielded housing can form a compartment for receiving the device under test. Shielded in this context re-fers to a housing that is shielded or shields the inside at least from electromagnetic waves e.g. of a predetermined frequency band. The shielded housing provides a space free, as much as possible, of exterior influences for performing the respective tests with the device under test. The removable cover can e.g. be a door that is secured with hinges to the shielded housing. The cover can also be fixed to the shielded housing via springs, clamps or clips that allow completely removing the removable cover from the shielded housing. It is understood that the removable cover can be of the same material as the shielded housing to provide the same shielding properties as the shielded housing.

In a possible embodiment, the test chamber can comprise a transparent section in the housing. This section allows visually inspecting the device under test while the test is being performed. The transparent section can e.g. be provided in the detachable housing.

In a possible embodiment, the transparent section can comprise a metallic shielding, e.g. a metallic mesh. Such a metallic shielding allows providing the transparent section without deteriorating the shielding effect of the shielded housing.

In a possible embodiment, the test chamber can comprise on the inside at least one wired test connector for contacting the device under test, wherein the wired test connectors are coupled to respective ones of the first electrical contacts. Inside of the test chamber for example a wired test connector can be provided that can be connected to the device under test. This allows testing wired devices under test. The wires to/from the test connector can e.g. be shielded to prevent the wires acting as antennas.

In a possible embodiment, the test chamber can comprise on the inside at least one antenna that can be connected to respective ones of the first electrical contacts. Antennas in the test chamber can e.g. be used to emit wireless signals or to receive wireless signals provided by the device under test.

In a possible embodiment, the test chamber can comprise a number, e.g. one or more, of cameras for recording the device under test. A camera can be used to e.g. visually inspect the device under test while the test is performed. For example visual feedback provided by the device under test can thus be evaluated. It is understood, that a monitor can be provided with the camera in the signal processing unit. For example a screen or a section of the screen of the signal processing unit can be used to display the camera image. Further, an automated evaluation can e.g. be performed based on image recognition algorithms or the like.

In a possible embodiment, the receiving portion can comprise a number, e.g. one or more, of RF shield contacts configured to contact the test chamber via a low impedance connection. The RF shield contacts can e.g. be laminar or planar contacts. The RF shield contacts can e.g. be pre-loaded or pre-stressed towards the test chamber. When the test chamber is inserted into the receiving portion the RF shield contacts will therefore be pressed onto the housing of the test chamber and provide the respective low impedance connection.

In a possible embodiment, the main housing can comprise signal processing means for providing signals to the test chamber via the second electrical contacts and/or for receiving signals from the test chamber via the second electrical contacts. The signal processing means can e.g. comprise electronic devices like e.g. processors, signal generators, DSPs, FPGAs, CPLDs and the like. It is understood that any necessary analogue circuitry, e.g. filters, amplifiers and the like, can also be provided.

In a possible embodiment, the main housing can comprise a user interface and/or a data interface. The signal processing unit can e.g. be a mobile device tester, a signal generator, a spectrum analyzer, a network tester or the like. The user interface allows the respective user, e.g. a test engineer, to interact with the signal processing unit. The data interface allows integrating the signal processing unit e.g. into a networked test infrastructure. This allows e.g. storing or loading test data in or from a data server, respectively.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which:

FIG. 4 shows a flow diagram of an embodiment of a method according to an embodiment of the present invention.

Figure 1:
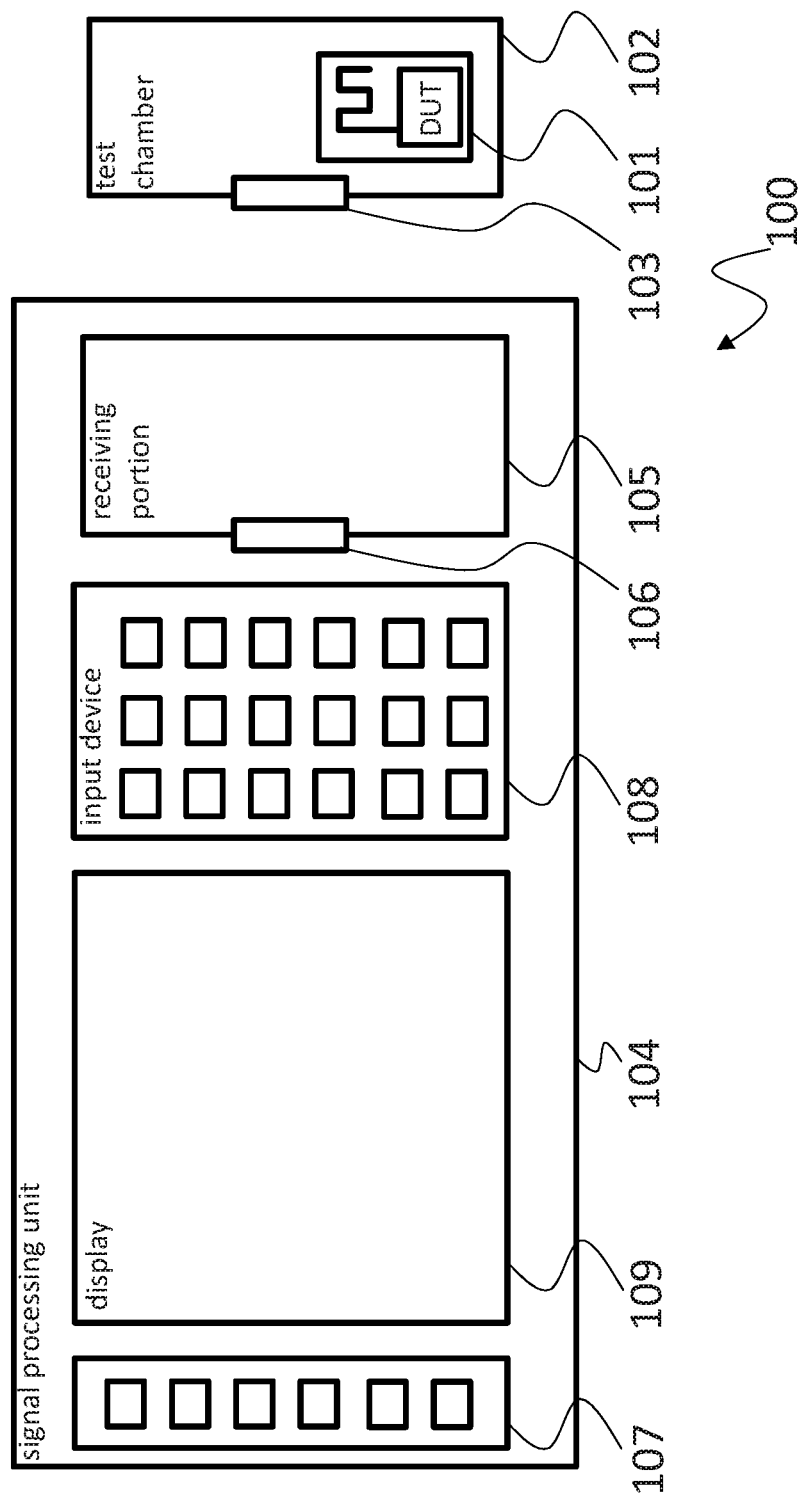
FIG. 1 shows a block diagram of an embodiment of a signal processing unit according to an embodiment of the present invention.

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

FIG. 1 shows a signal processing unit 100 for testing a device under test 101. The device under test 101 is shown as a PCB comprising an IC and a printed circuit antenna. It is understood that this device under test 101 is just an example and that any other electronic device could be used with the signal processing unit 100.

The signal processing unit 100 comprises a main housing 104. In the main housing 104 just exemplarily user input devices 107, 108 and a display 109 are provided. It is understood, that these input devices 107, 108 and the display 109 can vary between applications and can e.g. be provided in different arrangements for different signal processing units 100.

The signal processing unit 100 further comprises a test chamber 102. In FIG. 1 the test chamber 102 is detached from the main housing 104. However, as will be described on more detail below, the test chamber 102 can be inserted into a receiving portion 105 of the main housing 104 to perform testing of the device under test 101.

The test chamber 102 comprises first electrical contacts 103. The receiving portion 105 comprises respective second electrical contacts 106. When the test chamber 102 is inserted into the receiving portion 105 the first electrical contacts 103 will be electrically coupled to the second electrical contacts 106 and therefore allow transmitting electrical signals into or out of the test chamber 102.

The signal processing unit 100 can e.g. be a mobile device tester, a signal generator, a spectrum analyzer or the like. A user can e.g. control the signal processing unit 100 via the user input devices 107, 108 and receive e.g. measurement results via the display 109.

The user can use the signal processing unit 100 according to the present invention e.g. to test mobile devices, like the device under test 101. Since modern wireless networks use increasingly high frequencies, the devices under test 101 become smaller. Therefore, the size of the test chamber 102, even if it may be reduced compared to known test arrangements, will still suffice to test the respective devices.

At the same time, the arrangement of the present invention provides an integrated measurement environment for testing such devices under test 101. By integrating the test chamber 102 into the main housing 104, any wiring necessary between a test device and an external test housing is removed.

Especially in the GHz frequency range, cables can introduce unwanted damping or interferences. Therefore, the quality and reliability of the respective tests is improved with the present patent application.

Figure 2:
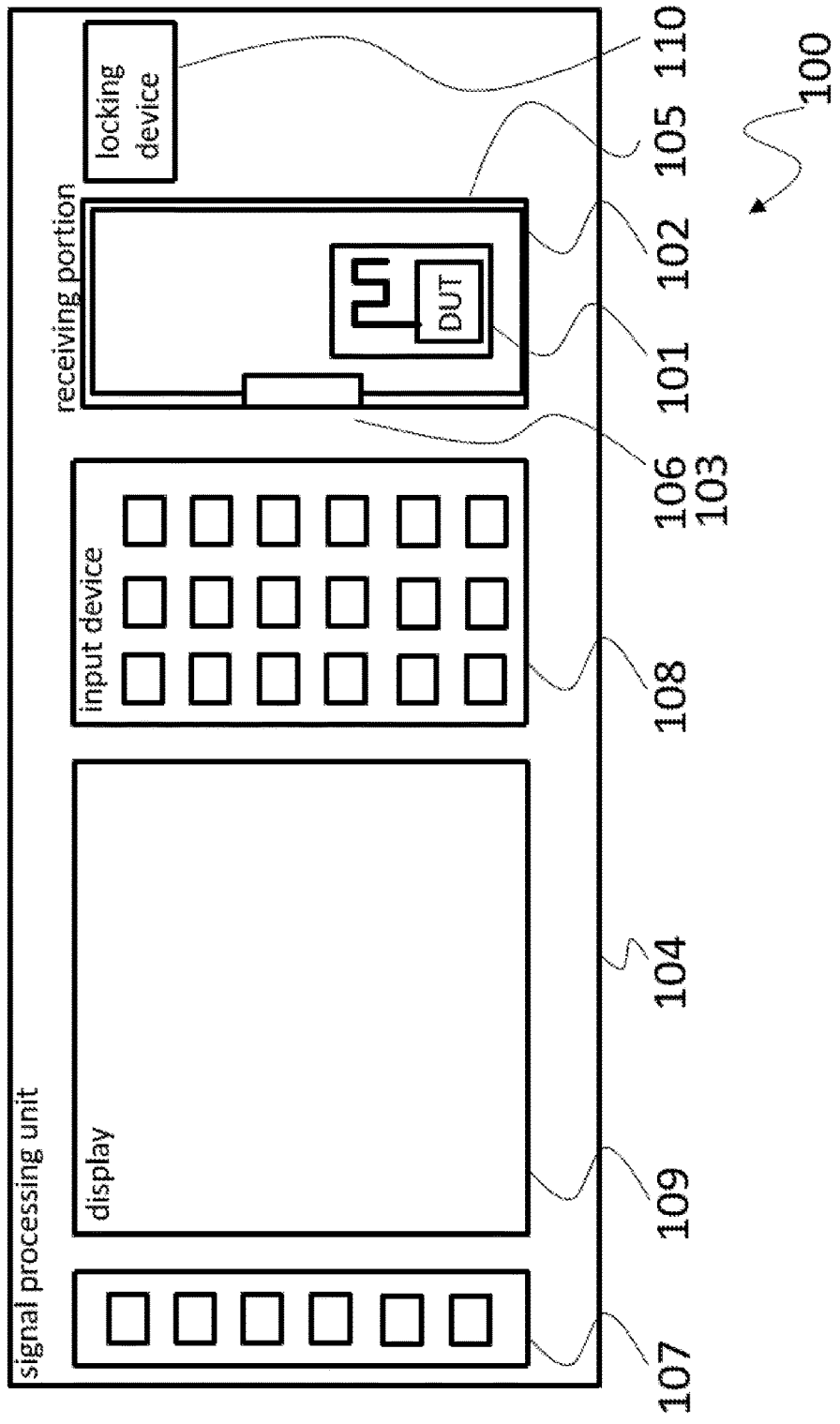
FIG. 2 shows another block diagram of the embodiment of a signal processing unit according FIG. 1.

FIG. 2 shows the signal processing unit 100, wherein the test chamber 102 is inserted into the main housing 104. Schematically it is shown that the first electrical contacts 103 are now in electrical contact with the second electrical contacts 106.

This means that the first and second electrical contacts 103, 106 substitute any cables that would be necessary with common measurement equipment. The first and second electrical contacts 103, 106 can therefore be chosen or designed such that all aspects like e.g. sufficient rigidity, isolation, shielding and the like are taken into account for the respective application. It is further understood that the position of the first and second electrical contacts 103, 106 is just chosen exemplarily.

The test chamber 102 is detachably coupled to the main housing 104. This allows extracting the test chamber 102 e.g. for easier manipulation or handling. Further, different test chambers 102 can be provided for different devices under test 101. In FIG. 1 for example the test chamber 102 fits into the receiving portion 105 of the main housing 104. As an alternative another test chamber could e.g. use the receiving portion 105 only as an anchor for electrically and mechanically fixing the test chamber 102. The compartment for receiving the device under test 101 could however extend over the circumference of the receiving portion 105 to accommodate bigger devices under test 101. The receiving portion 105 would in this case serve as a kind of receptacle. As an alternative to the detachable test chamber 102, the test chamber 102 can also be permanently fixed to the main housing 104.

Figure 3:
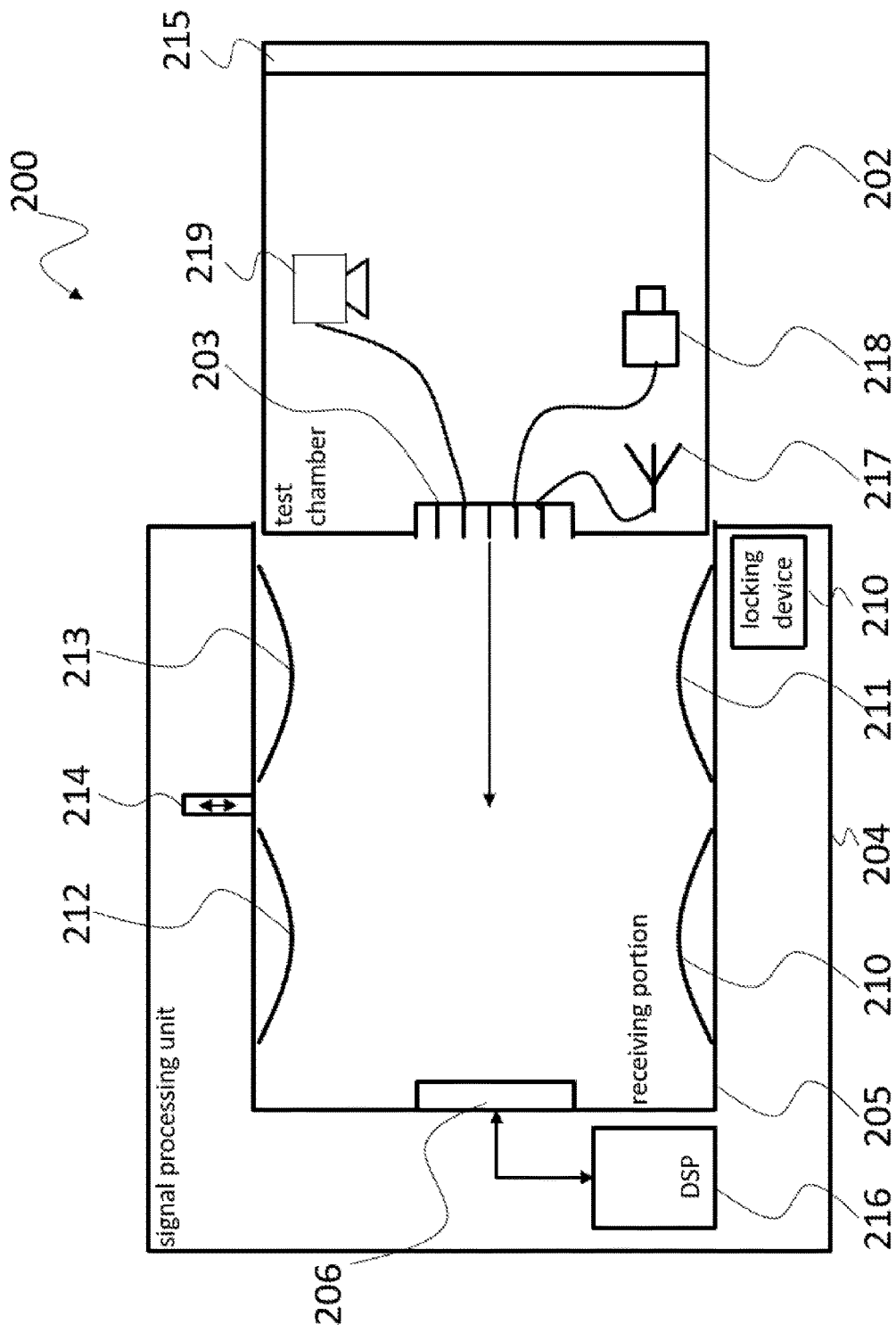
FIG. 3 shows a block diagram of an embodiment of another signal processing unit according to an embodiment of the present invention.

In FIG. 3 a signal processing unit 200 is shown in a sectional view that shows the main housing 204 and the insight of the receiving portion 205. The receiving portion 205 in a side view extends square-shaped into the main housing 204. In three dimensional space the receiving portion 205 can e.g. be box-shaped. A test chamber 202 is provided next to the receiving portion 205 and also shown in a sectional view and has a shape analogous to the shape of the receiving portion 205.

The main housing 204 comprises a processor 216, e.g. a digital signal processor 216, that generates signal for transmission to test chamber 202 or that receives signals from the test chamber 202. The processor 216 is shown schematically to indicate that the signal processing unit 200 can comprise any type of digital logic element or a combination of such elements, like e.g. a processor, a DSP, a microcontroller, an embedded system, an ASIC, a FPGA, a CPLD or the like, that performs signal processing, e.g. generation and reception. Such a digital logic element can e.g. also control user interactions of a user with the signal processing unit 200.

The processor 216 is connected to the second electrical contacts 206 on the back wall of the receiving portion 205, which will contact the first electrical contacts 103 when the test chamber 202 is inserted into the receiving portion 205.

The receiving portion 205 further comprises springs 210, 211, 212, 213, which are provided pairwise on the insides of the upper and the lower exterior walls of the receiving portion 205. The springs on the one hand mechanically clamp the test chamber 202. On the other hand the springs may be grounded and therefore provide a large-area or low inductance ground connection for the test chamber 202. In addition to the springs 210, 211, 212, 213 any other mechanical guide or rail can also be provided to guide the test chamber 202.

Finally, the receiving portion 205 comprises a bolt 214 for fixing the test chamber 202 when it is inserted into the receiving portion 205. It is understood that the bolt 214 is just schematically shown and that any other adequate mechanical element can be used for fixing the test chamber 202 in the receiving portion 205. The bolt 214 can e.g. be actuated manually or electronically. The respective actuator is not shown for sake of simplicity.

The test chamber 202 comprises the first electrical contacts 103. The first electrical contacts 103 will engage with the second electrical contacts 106 as explained above and allow the processor 216 to transmit and receive signals to/from the test chamber 202. In the test chamber 202 an antenna 217 is shown that is coupled to the first electrical contacts 103. Further, an electrical connector 218 is coupled to the first electrical contacts 103. Finally, a camera 219 is also coupled to the first electrical contacts 103. It is understood that the antenna 217, the electrical connector 218 and the camera 219 are optional and any combination of the antenna 217, the electrical connector 218 and the camera 219 can be provided in the test chamber 202. For example only the antenna 217 or only the electrical connector 218 or only the camera 219 could be provided. As an alternative the antenna 217 and the electrical connector 218 or the antenna 217 and the camera 219 could be provided. Further, only the electrical connector 218 and the camera 219 could be provided. It is further understood that the antenna 217, the electrical connector 218 and the camera 219 are just exemplarily shown to indicate any number of such elements.

The antenna 217 serves to transmit or receive RF signals to or from the device under test. The same applies to the connector 218, only that the signal transmission will be wired instead of wireless. Finally, the camera 219 serves to visually monitor feedback or behavior of the device under test.

The test chamber 202 also comprises a removable cover 215 that when removed provides access to the inside of the test chamber 202. The removable cover 215 can e.g. be a door or a detachable plate.

FIG. 4 shows a flow diagram of an embodiment of a signal processing method for testing an electronic device under test 101. For sake of clarity the reference signs used with FIGS. 1-3 will also be used to describe the method of FIG. 4.

The method starts with providing S1 a test chamber 102, 202 for accommodating the device under test 101, the test chamber 102, 202 comprising first electrical contacts 103, 203. Further, a main housing 104, 204 is provided S2, the main housing 104, 204 comprising a receiving portion 105, 205 for receiving the test chamber 102, 202, and comprising second electrical contacts 106, 206. Finally, the first electrical contacts 103, 203 of the test chamber 102, 202 in an inserted stated of the test chamber 102, 202 are contacted with the second electrical contacts 106, 206.

With the setup provided by the above steps, the testing can then easily be performed by providing or receiving signals to or from a device under test 101 in the test chamber 102, 202.

The method can further comprise e.g. coupling the test chamber 102, 202 permanently to the receiving portion 105, 205 or coupling the test chamber 102, 202 detachably to the receiving portion 105, 205. Further, the test chamber 102, 202 can be locked in position with a locking device 110, 210 in the main housing 104, 204.

Signals can be provided to the test chamber 102, 202 via the second electrical contacts 106, 206 and/or received from the test chamber 102, 202 via the second electrical contacts 106, 206 with signal processing means, e.g. a processor 216, in the main housing 104, 204.

The method can further comprise providing the test chamber 102, 202 with a shielded housing with a removable cover 215. The shielded housing will then form a compartment for receiving the device under test 101. To allow visual inspection of the device under test 101, the test chamber 102, 202 can be provided with a transparent section in the housing. This transparent section can further comprise a metallic shielding. The test chamber 102, 202 can also be contacted via a low impedance connection via a number of RF shield contacts of the receiving portion 105, 205.

For testing, the device under test 101 can be contacted with a wired test connector 218 on the inside of the test chamber 102, 202. Such wired test connectors 218 can e.g. be coupled to respective ones of the first electrical contacts 103, 203. In addition or as an alternative signals can be transmitted to the device under test 101 or received from the device under test 101 via at least one antenna 217 on the inside of the test chamber 102, 202.

Finally, a number of cameras can be provided in the test chamber 102, 202 for recording the device under test 101 while the test is performed.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200 signal processing unit
101 device under test
102, 202 test chamber
103, 203 first electrical contacts
104, 204 main housing
105, 205 receiving portion
106, 206 second electrical contacts
107, 108 user input
109 display
210, 211, 212, 213 springs
214 bolt
215 removable cover
216 digital signal processor
217 antenna
218 connector
219 camera
S1-S3 method actions

The invention claimed is:

1. A signal processing unit for testing an electronic device under test, the signal processing unit comprising:
a test chamber for accommodating the device under test, the test chamber comprising first electrical contacts, and
a main housing comprising a receiving portion for receiving the test chamber, and comprising second electrical contacts that contact the first electrical contacts of the test chamber in an inserted state of the test chamber, the receiving portion comprising one or more springs to secure the test chamber in the inserted state, wherein the test chamber is detachably coupled to the receiving portion, and wherein the main housing comprises a locking device for locking the test chamber in position,
wherein the test chamber comprises a shielded housing with a removable cover, the shielded housing forming a compartment for receiving the device under test, and the shielded housing shields the inside of the shielded housing from electromagnetic waves.

2. The signal processing unit of claim 1, wherein the test chamber is permanently coupled to the receiving portion.

3. The signal processing unit of claim 1, wherein the test chamber is detachably coupled to the receiving portion.

4. The signal processing unit of claim 3, wherein the main housing comprises a locking device for locking the test chamber in position.

5. The signal processing unit of claim 1, wherein the test chamber comprises a transparent section.

6. The signal processing unit of claim 5, wherein the transparent section comprises a shielding, especially a metallic shielding.

7. The signal processing unit of claim 1, wherein the test chamber comprises on the inside one or more wired test connectors for contacting the device under test, wherein the wired test connectors are coupled to respective ones of the first electrical contacts.

8. The signal processing unit of claim 1, wherein the test chamber comprises on the inside antennas that are connected to respective ones of the first electrical contacts.

9. The signal processing unit of claim 1, wherein the test chamber comprises a number of cameras for recording the device under test.

10. The signal processing unit of claim 1, wherein the receiving portion comprises a number of RF shield contacts configured to contact the test chamber via a low impedance connection.

11. The signal processing unit of claim 1, comprising signal processing means for providing signals to the test chamber via the second electrical contacts and/or for receiving signals from the test chamber via the second electrical contacts.

12. The signal processing unit of claim 1, wherein the main housing comprises a user interface and/or a data interface.

13. A signal processing method for testing an electronic device under test, the signal processing method comprising:
  providing a test chamber for accommodating the device under test, the test chamber comprising first electrical contacts, the test chamber comprising a shielded housing with a removable cover, the shielded housing forming a compartment for receiving the device under test, and the shielded housing shields the inside of the shielded housing from electromagnetic waves,
  providing a main housing comprising a receiving portion for receiving the test chamber, and comprising second electrical contacts, the receiving portion comprising one or more springs to secure the test chamber in the inserted state, wherein the test chamber is detachably coupled to the receiving portion, and wherein the main housing comprises a locking device for locking the test chamber in position, and
  contacting the first electrical contacts of the test chamber in an inserted state of the test chamber with the second electrical contacts.

14. The signal processing method of claim 13, comprising coupling the test chamber permanently to the receiving portion.

15. The signal processing method of claim 13, comprising coupling the test chamber detachably to the receiving portion.

16. The signal processing method of claim 15, comprising locking the test chamber in position with a locking device in the main housing.

17. The signal processing method of claim 13, comprising providing the test chamber with a transparent section in the housing, especially wherein the transparent section comprises a metallic shielding.

18. The signal processing method of claim 13, comprising contacting the device under test with at least one wired test connector on the inside of the test chamber, wherein the wired test connectors are coupled to respective ones of the first electrical contacts, and/or comprising transmitting signals to the device under test or receiving signals from the device under test via antennas on the inside of the test chamber that are connected to respective ones of the first electrical contacts.

19. The signal processing method of claim 13, comprising providing a number of cameras in the test chamber for recording the device under test.

20. The signal processing method of claim 13, comprising contacting the test chamber via a low impedance connection via a number of RF shield contacts of the receiving portion.

21. The signal processing method of claim 13, comprising providing signals to the test chamber via the second electrical contacts and/or receiving signals from the test chamber via the second electrical contacts with signal processing means in the main housing.

22. The signal processing method of claim 13, providing a user interface and/or a data interface in the main housing.

* * * * *